(12) United States Patent
Hill

(10) Patent No.: US 6,476,340 B1
(45) Date of Patent: Nov. 5, 2002

(54) ELECTRON BEAM GUN WITH GROUNDED SHIELD TO PREVENT ARC-DOWN AND GAS BLEED TO PROTECT THE FILAMENT

(75) Inventor: Russell J. Hill, El Cerrito, CA (US)

(73) Assignee: The BOC Group, Inc., Murray Hill, NJ (US)

( * ) Notice: Subject to any disclaimer, the term of this patent is extended or adjusted under 35 U.S.C. 154(b) by 0 days.

(21) Appl. No.: 09/545,731

(22) Filed: Apr. 10, 2000

Related U.S. Application Data
(60) Provisional application No. 60/129,272, filed on Apr. 14, 1999.

(51) Int. Cl.$^7$ .............................................. H01J 37/305
(52) U.S. Cl. ................................................ 219/121.15
(58) Field of Search ....................... 219/121.12, 121.15, 219/121.21, 121.22; 118/726; 373/10, 11; 392/389

(56) References Cited

U.S. PATENT DOCUMENTS

| | | |
|---|---|---|
| 2,848,523 A | 8/1958 | Hanks et al. |
| 2,935,395 A | 5/1960 | Smith, Jr. |
| 2,942,098 A | 6/1960 | Smith, Jr. |
| 2,994,801 A | 8/1961 | Hanks |
| 3,040,112 A | 6/1962 | Smith, Jr. |
| 3,078,326 A | 2/1963 | Smith, Jr. |
| 3,078,388 A | 2/1963 | Hanks et al. |
| 3,170,019 A | 2/1965 | Hanks |
| 3,204,096 A | 8/1965 | Anderson et al. |
| 3,394,217 A | 7/1968 | Fisk |
| 3,400,253 A | 9/1968 | Marker |
| 3,409,729 A | 11/1968 | Hanks et al. |
| 3,483,423 A | 12/1969 | Hanks |
| 4,311,725 A * | 1/1982 | Holland ........................ 427/10 |
| 5,216,690 A | 6/1993 | Hanks |
| RE35,024 E | 8/1995 | Hanks |

OTHER PUBLICATIONS

K. R. Spangenberg, "Vacuum Tubes", 1948, pp. 755–758.

* cited by examiner

Primary Examiner—Samuel M. Heinrich
(74) Attorney, Agent, or Firm—Philip H. Von Neida; Salvatore P. Pace

(57) ABSTRACT

The present invention provides for an improved electron gun evaporation source using high direct current negative voltage for forming high energy electron beams to produce thin-film coatings on a variety of substrates. The present invention further provides for the use of a grounded metallic shield which functions as an electrode enclosing both the filament leads and emitter structures of an electron beam source.

20 Claims, 2 Drawing Sheets

ELECTRON BEAM GUN WITH GROUNDED SHIELD TO PREVENT ARC-DOWN AND GAS BLEED TO PROTECT THE FILAMENT

This application claims priority based on Provisional Patent Application Serial No. 60/129,272, filed Apr. 14, 1999.

FIELD OF THE INVENTION

This invention relates to a new and improved electron gun evaporation source which uses high direct current negative voltage (HV) to form high energy electron beams for high vacuum evaporation for producing thin-film coatings on various substrates. More particularly, the invention relates to the use of a grounded metallic shield which functions as an electrode enclosing the filament leads and emitter structures of an electron beam source in a high vacuum chamber and a gas bleed to protect the filament of the gun.

BACKGROUND OF THE INVENTION

High vacuum electron beam heated evaporation (and sublimation) sources are used in coaters for the manufacture of thin-film optical devices, semiconductor devices used in integrated circuits and many other devices employing thin-film technology. The voltages used in these applications vary between about 4 kV and up to 30 kV with a nominal value of 10 kV.

It has been found that in the operation of electron beam sources, the operation can be disrupted by the build up of a glow discharge or worse, the initiation of an arc. This has an adverse effect that besides interrupting the application of power for evaporation, an arc can be struck which can melt and destroy vital parts of the coater. The solution to this problem has been the use of power supplies which can detect the rapid increase in current which signals the start of an arc. The use of very rapid switching devices often based on tetrode tubes then reduces the voltage (and thus power) to zero. The use of these rapid "switch-off" power supplies is perfectly acceptable when evaporation is performed in high vacuum better than $10^{-4}$ Torr.

When thin-films of materials used in optical coatings are required, it has been found that particularly when oxides are used, it is necessary to add oxygen to the coating system to assure that the coating is not deficient in oxygen but remains stoichiometric. This is a result of the mode of evaporation of compounds which often evaporate as their constituents and only recombine on the surface. As an example, silica evaporates (or more correctly sublimes) as SiO and $O_2$. It is because the oxygen is more mobile and more rapidly pumped away that additional gas must be added to the coater so that adequate oxygen appears at the condensing surface and $SiO_2$ is formed instead of $SiO_x$ where x<2. Consequently, many optical coatings have to be conducted like reactive evaporations and the electron beam source must operate in the pressure range between $10^{-4}$ and $10^{-3}$ Torr.

In coaters using high power electron beam evaporation at these "high" pressures, without special precautions, the rapid occurrence of arcs cannot be controlled by the rapid "switch-off" power supplies, and the production of the thin-film is effectively prevented.

This effect was first described in 1889 by F. Paschen who found that the voltage breakdown could be related to the product of the pressure and distance of the gap between the electrodes. This effect was used in the design of high voltage vacuum equipment by L. Holland and was described in his book "Vacuum Deposition of Thin Films" published in 1966. On page 91 Holland says, "Thus undesirable discharges can be prevented by bringing the anode electrode near the cathode surface . . . " and a drawing is shown in which a high voltage lead is enclosed in a grounded shield having holes in it to assist pump down. For a particular pressure condition, the corresponding gap is called the 'dark space'. This is defined more particularly as it relates to thin film engineering in a book by D. Mattox published in 1998 entitled "Glossary of terms and acronyms used in surface engineering". The "Cathode Dark Space" is defined there as "The darker region of a plasma near the cathode surface where most of the potential drop in a DC diode discharge occurs. Region where electrons are being accelerated away from the cathode. Also called the Cathode sheath". The "Dark Space Shield" is defined there as "A grounded surface that is placed at less than a dark space width from the cathode in order to prevent establishing a discharge in the region between the two surfaces. Also called the Ground shield. See Paschen curve." The use of the 'dark space' has been used for many years to insulate components of differing voltage in vacuum environments.

While it is known how to reduce arcs even at 'high' pressure of $10^{-3}$ Torr, the life of the electron beam emitter filament is substantially reduced especially for the cases where oxygen is purposely introduced to the coater. This is because of the reaction first observed in incandescent filament lamps, that tungsten forms a volatile compound with oxygen which rapidly destroys the integrity of the filament.

SUMMARY OF THE INVENTION

The present invention reduces arcs at "high" operating pressures used in reactive and oxide evaporation and provides a condition where the filament emitter does not degrade by reaction with oxygen.

In accordance with this invention, it has been found that it is possible to make a filament from a metal which does not oxidize. Such a metal namely, iridium, a precious metal, is available. The work function of iridium is about 5.3 eV and is higher than tungsten which is about 4.5 eV. Furthermore, iridium has a substantially lower melting point (about 2454 deg C.) than tungsten (3410 deg C.). The Fredericks Company has solved this problem by coating the iridium with yttria which reduces the effective work function to 2.4 eV. We have used filaments like this and found that they are good substitutes for tungsten and do not oxidize but the cost of iridium is often prohibitive for commercial applications.

It has been found that if the shielded high voltage lead and gun structure is used together with a thin septum of metal such as stainless steel sheet about 0.010 inch thick placed over the exit place of the electron beam, an inert gas such as argon can be introduced to the shielded structure. When the electron beam is turned on initially, it automatically melts a hole in the stainless steel septum just big enough to allow it to escape. This technique was used by Chambers and Carmichael in their development of electron beam ion plating and was described in their paper in 'Research and Development' in May 1971 entitled "Processing parameters, measured with apparatus using electron beam evaporation that extends ion plating to a wider range of materials, provide a new basis for evaluating this third method of vacuum coating".

In addition it has been found that at the vacuum levels of interest ($10^{-2}$ to $10^{-4}$ Torr) if gas such as argon is introduced to the inside of the shield, the flow through the small hole in the septum or shield will be sonic. Consequently, if the gas introduced is inert the tungsten filament will be effectively shielded from any oxygen.

DESCRIPTION OF PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

The present invention suppresses the start of the initial phases of arc or glow formation. This is accomplished by making the space available to electron flow from HV negative surfaces to zero, or ground, voltage limited in distance to a little less than the distance of the electron mean free path at the highest pressure anticipated. The electrons making the transit, although accelerating very fast going from high voltage cathode surfaces to nearby zero voltage ground, have minimal ion collision probability over that entire distance. The electrons merely transfer to ground at that spot a single 10 KV electron amount of energy, this is the dark space.

Figure 1:
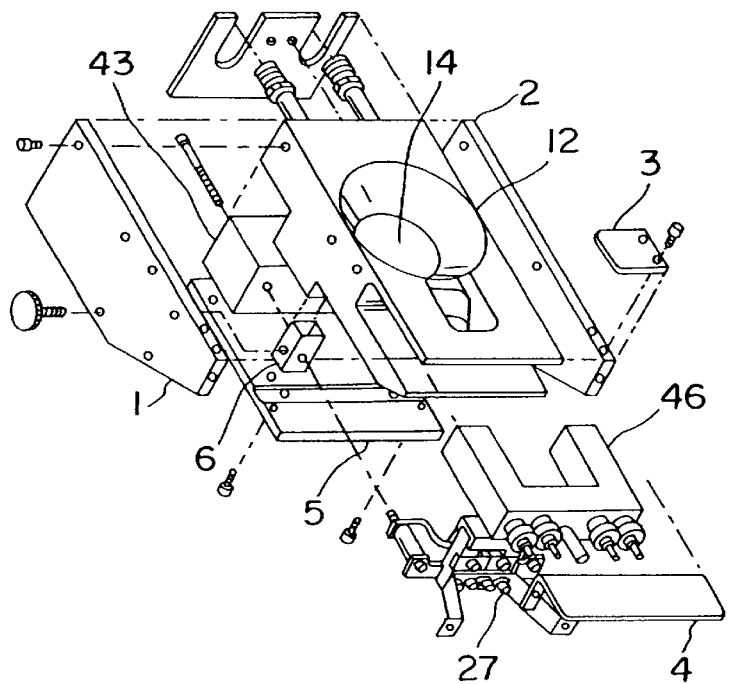
FIG. 1 is an exploded view of a typical 270° electron beam evaporation source.

While this invention can be used with many designs of electron beam evaporation sources, it is practical to incorporate it in transverse beam sources and in particular in the widely used 270° beam sources. For reference, FIG. 1 is an exploded view of a typical 270° source showing the key components. The electron beam gun assembly 27 is located below the water cooled copper crucible 12 which is enclosed with a left-hand pole piece 1 and a right-hand pole piece 2. The pole pieces are extensions of the permanent magnet 43 to provide the extended magnetic field which guides the electron beam generated by the gun assembly 27 through a 270° arc so as to impinge upon the evaporation material 14 contained in the crucible 12. The magnetic field can be modified in a fixed way by the use of pole extensions 3, or in a variable way by changing the current in the electromagnet 46. The electrical connections to the electromagnet are protected by a shield 4. The assembly is held together by a base plate 5, and the emitter assembly 27 is attached to it via the support blocks 6.

Figure 2:
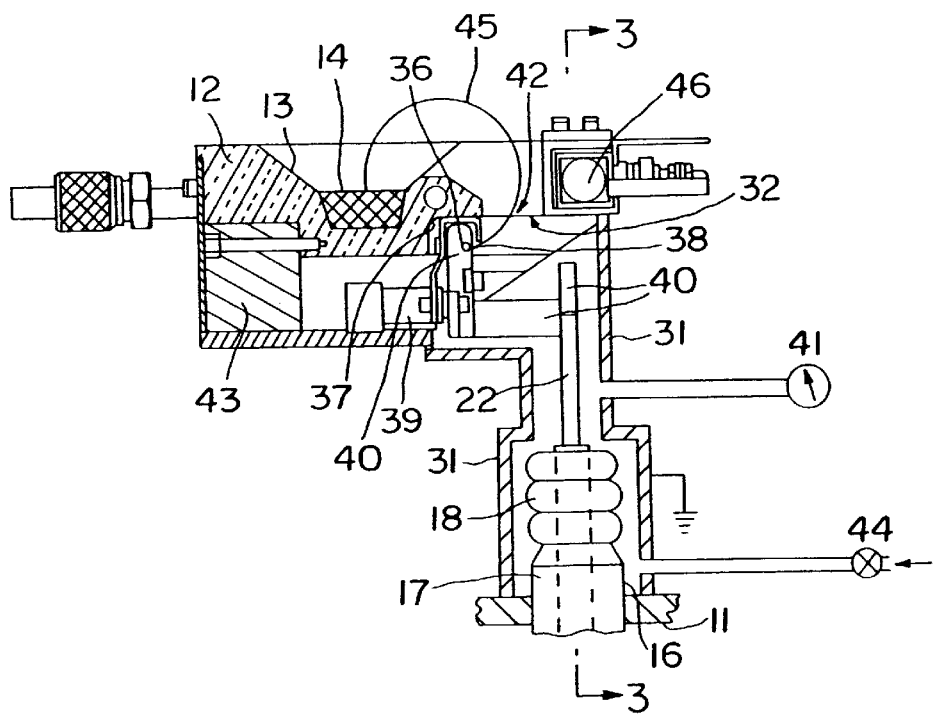
FIG. 2 is a schematic view showing a portion of a vacuum chamber employing the present invention.
Figure 3:
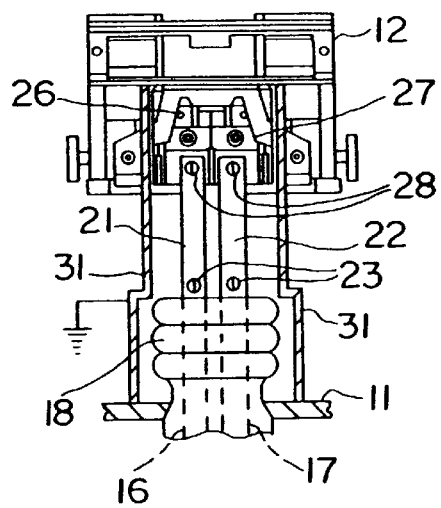
FIG. 3 is a sectional view taken substantially along the line 3—3 of FIG. 2, viewed in the direction of the arrows.
Figure 4:
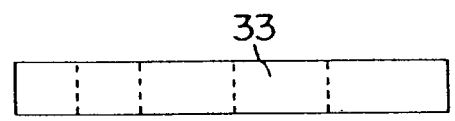
FIG. 4 is a view of a portion of FIG. 2 showing an improved septum or shield.
Figure 4:
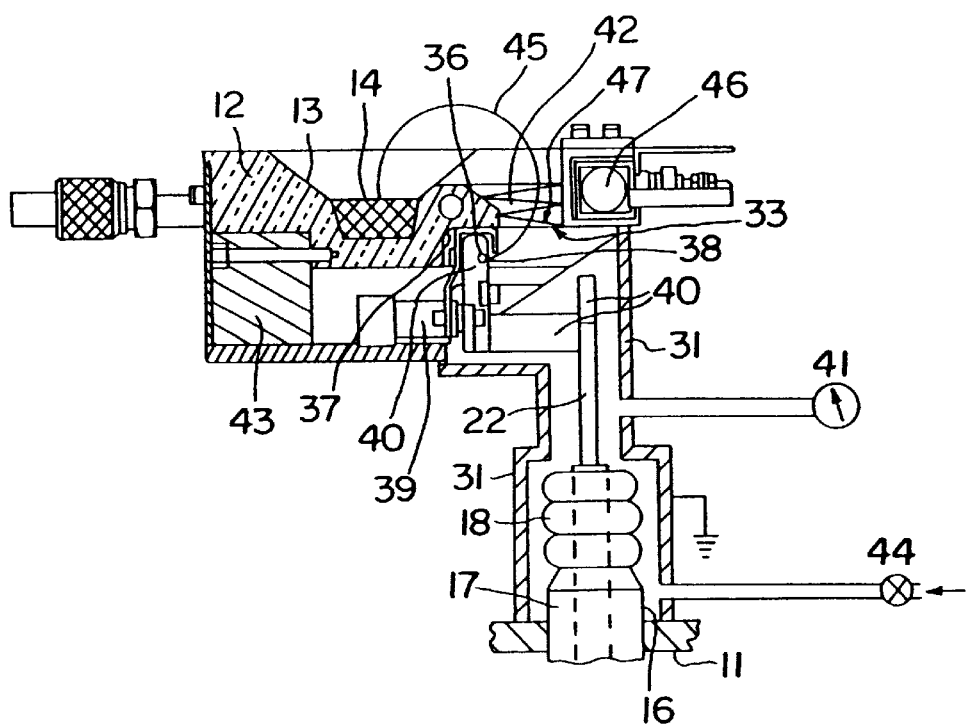

Directing attention now to the modification of FIGS. 2–4 of the accompanying drawings, a vacuum chamber is illustrated generally by a fragment of a vacuum chamber wall 11. Within the chamber is a crucible 12 formed with a hollow 13 in which is disposed a metal or compound 14 to be evaporated or sublimed. High voltage feed-ins 16 and 17 pass through the vacuum chamber wall 11, a conventional high-vacuum feedthrough 18 surrounding the feed-ins in order to preserve the vacuum, all as well understood in this art. Feed-ins 16 and 17 are connected to filament leads 21 and 22, respectively, by attachment screws 23 or other conventional means. Attached to each lead 21, 22 is an emitter structure 26, 27 also connected by attachment screws 28 or other conventional means. The normal function of such a structure is to bombard the metal or compound 14 in the crucible 12 with electrons from the aforementioned electron gun. Such bombardment causes either evaporation or sublimation of the metal or compound 14, all as well understood in this art.

Directing attention now to the details of the emitter structure 40 shown in FIG. 2, filament 36 and anode 37 cause emission guided by the beam former electrode 38 which is insulated by HV insulator 39. The beam path opening 42 is formed in the shield 32 by the initiation of the electron beam.

The vacuum chamber is at a range of different pressures depending upon the use to which the electron gun is put.

In accordance with the present invention, a metallic shield 31 is installed around all of the HV elements and specifically the lead-ins 21,22 feed through 18 and emitter structure 26, 27. The spacing between the shield 31 and the aforesaid elements (herein referred to as "HV elements") is less than the dark space at a pressure of $10^{-3}$ or more Torr for a vacuum coating installation. This amounts to a spacing of approximately ¼ inch between the HV surfaces and ground throughout the chamber. In practical effect, the round rod filament leads 21, 22 were positioned inside a metal tube in a coaxial arrangement. The emitter structure 26, 27 was encased by metal sheets, also spaced ¼ inch therefrom. The beam itself makes a small hole 32 where it exits from the shield 31 in its path into the crucible 12.

All of the aforementioned is well known in this art, but this invention additionally provides a control of the gas in the dark space both in terms of pressure and type of gas used. While the shields are not meant to be hermetically sealed, there are no gaps or slits intentionally added to the shields 31 around the high voltage leads as taught by Holland and in U.S. Pat. No. 5,216,690 and its reissue U.S. Pat. No. 35,024 and the beam opening 42 in the shield 31 is kept as small as possible. The system chamber and the dark space can therefor be effectively isolated, but the whole can be effectively evacuated on initial pump down.

As an example, in the sublimation of silica, oxygen is bled into the system to maintain a pressure of $1\times10^{-4}$ Torr while argon gas from source 44 is introduced to the dark space between the high voltage leads 21, 22 and the shield 31 at a pressure of at least $2.3\times10^{-4}$ Torr. The pressure inside the volume enclosed by the shield can be monitored with gauge 41. At this pressure difference, the flow through the beam opening will be sonic and consequently prevents oxygen from entering the dark space gap between the shields and the leads. The hot tungsten filament 36 in the emitter 26, 27 cannot oxidize and will not prematurely fail.

The modification of FIG. 2 shows the electron beam 45 turning through an arc of 270° in the path from the emitter structure 40 to the material 14 in crucible 12. There is a disadvantage to this arrangement in that the pressure difference between the chamber and the dark space is separated by a single burn through hole in the opening 32 into the emitter structure 36.

In many respects the elements of FIG. 4 resemble that of the preceding modification and the same reference numerals followed are used to designate corresponding parts. An improved shield 33 is shown in FIG. 4 and is a strip of thin metal sheet such as 0.010 inch thick which has been cut to form a long strip whose width is that of the width of the beam opening 42 and long enough so that it can be folded to form many convolutions when placed in the opening. In FIG. 4 a strip is shown having 6 convolutions. On initial operation of the electron beam, each convolution will sequentially have a small hole formed in it by the beam melting the stainless steel. This structure will be approximately 6 times more effective than the single shield in supporting a pressure differential between the chamber vacuum and that in the shield assembly around the HV leads.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. An electron beam gun contained in a high vacuum chamber comprising:
    a plurality of high voltage surfaces comprising an emitter structure connected through filament leads to an external high voltage source;
    a metallic shield surrounding said high voltage surfaces, wherein said shield has a hole through which a path of electrons from said emitter structure flow to a target in said vacuum chamber;
    grounding means for said shield;
    a crucible;
    means to focus and direct said path of electrons from said emitter structure to said crucible over an arc passing through said hole.

2. The electron beam gun as claimed in claim 1 wherein said filament leads comprise rods.

3. The electron beam gun as claimed in claim 2 where said shield comprises at least one tube in co-axial relation to said rods.

4. The electron beam gun as claimed in claim 1 wherein said shield comprises metal sheets substantially enclosing said emitter.

5. The electron beam gun as claimed in claim 1 wherein the volume within said shield is monitored for vacuum level.

6. The electron beam gun as claimed in claim 5 further comprising means to introduce gas into said volume.

7. The electron beam gun as claimed in 1 wherein said path of electrons is over an arc of about 270°.

8. The electron beam gun as claimed in claim 1 wherein said path of electrons is over an arc of about 180°.

9. The electron beam gun as claimed in claim 1 wherein said high vacuum chamber is maintained at a pre-selected vacuum.

10. The electron beam gun as claimed in claim 1 wherein said shield is spaced from said high voltage surfaces a distance less than the mean dark space for said pre-selected vacuum.

11. The electron beam gun as claimed in claim 1 wherein said filaments comprise iridium metal coated with yttria.

12. The electron beam gun as claimed in claim 1 wherein said shield contains no slits or gaps.

13. The electron beam gun as claimed in claim 1 further comprising vacuum measuring means.

14. The electron beam gun as claimed in claim 1 wherein said crucible comprises a hollow shape.

15. The electron beam gun as claimed in claim 14 wherein said crucible hollow contains target material.

16. The electron beam gun as claimed in claim 15 wherein said target material is subject to evaporation or sublimation.

17. The electron beam gun as claimed in claim 1 wherein said shield comprises at least one tube in co-axial relation to said filament leads.

18. The electron beam gun as claimed in claim 17 wherein said shield comprises at least one tube in a non-circular cross section and essentially in co-axial relation to said filament leads.

19. The electron beam gun as claimed in claim 1 wherein said shield comprises a plurality of shields.

20. The electron beam gun as claimed in claim 19 wherein said plurality of shields comprise a plurality of holes.

* * * * *